(12) United States Patent
Tuncer et al.

(10) Patent No.: US 11,838,004 B2
(45) Date of Patent: Dec. 5, 2023

(54) ACOUSTIC DEVICE PACKAGE AND METHOD OF MAKING

(71) Applicant: TEXAS INSTRUMENTS INCORPORATED, Dallas, TX (US)

(72) Inventors: Enis Tuncer, Dallas, TX (US); Abram Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 802 days.

(21) Appl. No.: 16/356,890

(22) Filed: Mar. 18, 2019

(65) Prior Publication Data

US 2019/0214964 A1    Jul. 11, 2019

Related U.S. Application Data

(62) Division of application No. 14/698,616, filed on Apr. 28, 2015, now Pat. No. 10,284,172.

(51) Int. Cl.
*H03H 9/10* (2006.01)

(52) U.S. Cl.
CPC ........ *H03H 9/1042* (2013.01); *H03H 9/1007* (2013.01)

(58) Field of Classification Search
CPC .......................... H03H 9/1042; H03H 9/1007
See application file for complete search history.

(56) References Cited

U.S. PATENT DOCUMENTS

| 7,214,739 B2 * | 5/2007 | Kannan .................... C08K 5/17 |
| | | 524/178 |
| 8,421,226 B2 * | 4/2013 | Meyer ................ H01L 21/6835 |
| | | 257/738 |

* cited by examiner

*Primary Examiner* — Derek J Rosenau
(74) *Attorney, Agent, or Firm* — Dawn Jos; Frank D. Cimino

(57) ABSTRACT

An assembly including an electrical connection substrate formed of material having a Young's modulus of less than about 10 MPa, an acoustic device die having opposite end portions mounted on and electrically connected to the electrical connection substrate and a mold compound layer encapsulating the acoustic device die and interfacing with the substrate.

17 Claims, 2 Drawing Sheets

ACOUSTIC DEVICE PACKAGE AND METHOD OF MAKING

CROSS REFERENCE TO RELATED APPLICATIONS

This is a division of and claims priority to U.S. patent application Ser. No. 14/698,616, filed on Apr. 28, 2015, the entirety of which is hereby incorporated herein by reference.

BACKGROUND

Acoustic devices, such as bulk acoustic wave (BAW) devices have many applications in modern electronics, including cell phones and other wireless applications.

Microelectromechanical systems (MEMS) is the technology of very small devices, typically within a size range of about 1 mu to 1 mm. MEMS devices are produced with semiconductor fabrication technology. There are currently many types of MEMS devices used in many different applications, for example, microphones, pressure sensors, and mechanical resonators.

One common type of MEMS device is a BAW (Bulk Acoustic Wave) device. BAW devices are electromechanical devices that can be implemented as ladder or lattice filters. BAW devices typically operate at frequencies from around 2 to around 16 GHz, and may be smaller or thinner than equivalent SAW (Surface Acoustic Wave) devices. The two main variants of BAW devices are Thin Film Bulk Acoustic Resonator or FBAR and Solid Mounted Bulk Acoustic Resonator or SMR. BAW devices are frequently used in wireless applications. Various methods of designing and making BAW devices are known in the art. BAW devices are typically implemented at the "wafer level." Identical BAW structures are formed on a large semiconductor substrate (wafer) that is subsequently cut (singulated) into identical separate dies (dice).

SUMMARY

Disclosed herein is an assembly that includes an electrical connection substrate formed of material having a Young's modulus of less than about 10 MPa. The assembly also includes an acoustic device die having a mid portion and opposite end portions mounted on and electrically coupled to the electrical connection substrate. A mold compound layer encapsulates the acoustic device die and interfaces with the substrate.

Also disclosed is an assembly that includes an electrical connection substrate. An acoustic device die having a mid portion and opposite end portions is mounted on and electrically coupled to the electrical connection substrate. A mold compound layer encapsulates the acoustic device die and interfaces with the substrate. The mold compound layer has a Young's modulus of less than about 100 MPa.

Further disclosed herein is a bulk acoustic wave (BAW) package that includes a substrate formed of material having a Young's modulus of less than about 10 MPa with a first surface and an opposite second surface. First and second spaced apart contact pads are provided on the first surface and first and second spaced apart contact pads are provided on the second surface. The package also includes a BAW device. This BAW device includes a laterally extending body having an BAW electrical circuit formed therein. A first solder ball is attached to the laterally extending body and electrically couples the BAW electrical circuit to the first contact pad on the first surface of the substrate. A second solder ball is physically attached to the laterally extending body and is electrically coupled to the BAW electrical circuit and the second contact pad on the first surface of the substrate. First and second solder balls are attached to the first and second spaced apart contact pads on the second surface of the substrate. A mold compound layer encapsulates the BAW device and interfaces with the first surface of the substrate. The mold compound layer has a Young's modulus of less than about 100 MPa.

Also disclosed herein is a method of making a bulk acoustic wave (BAW) package. The method includes physically and electrically mounting a BAW device on an electrical connection substrate formed of material having a Young's modulus of less than about 10 MPa. The method further includes encapsulating the BAW device in a mold compound layer having a Young's modulus of less than about 100 MPa.

DETAILED DESCRIPTION

The inventors have discovered that vibration in a substrate upon which a BAW device is mounted and/or in the mold compound in which the device is encapsulated may produce undesirable effects is the device signal. The performance of the device degrades because the device acoustic characteristics are influenced by those of the package material. The performance degradation of the device may take various forms. For example one undesirable effect of the package material on the device may be a change in response frequencies. The inventors have discovered structure and techniques for reducing or eliminating such undesirable effects, as described below.

Figures 1, 2:
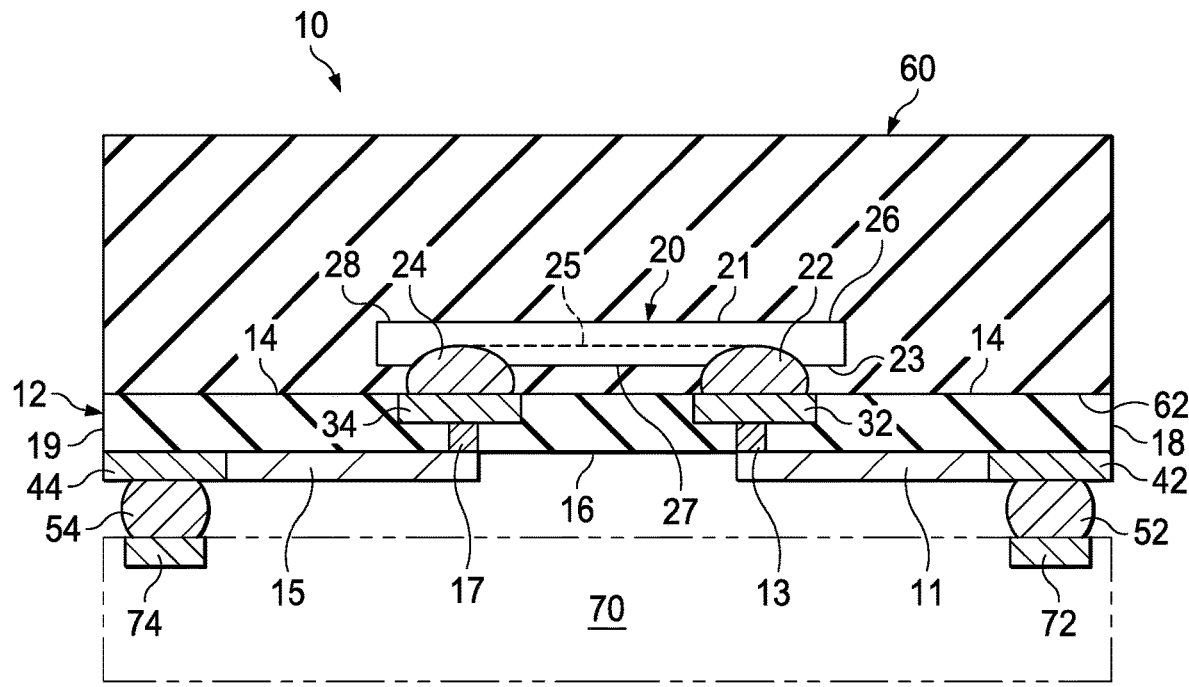
FIGS. 1 and 3 are schematic cross-sectional views of a bulk acoustic wave (BAW) device package.
FIG. 2 is a flow diagram of an example method of making a BAW device package.

FIG. 1 is a schematic cross-sectional view of a bulk acoustic wave (BAW) device package 10. A substrate 12 has a top surface 14, a bottom surface 16, a first end portion 18 and a second end portion 19. First and second spaced apart top contact pads 32, 34 are provided on the top surface 14 of the substrate. First and second spaced apart bottom contact pads 42, 44 are provided on the bottom surface of the substrate 12.

A BAW device die 20 has a top surface 21 and a bottom surface 23. A first solder ball 22 is attached to a first end portion 26 and a second solder ball 24 is attached to a second end portion 28 of the of the BAW device die 20. The solder balls 22, 24 are electrically connected to opposite terminals of a BAW electrical circuit 25 within the die 20. A mid portion 27 of the device die 20 is spaced apart from the top surface 14 of the substrate 12.

The first solder ball 22 of the device die 20 is attached to the first contact pad 32 on the top surface of the substrate 12. The second solder ball 26 of the device die 20 is attached to the second contact pad 34 on the top surface of the substrate 12. A first lower solder ball 52 is connected to the first bottom contact pad 42 of the substrate 12 and a second lower solder ball 54 is connected to the second bottom surface contact pad 44 of the substrate 12.

A first metallized circuit 11 is patterned on the bottom surface 16 of the substrate 20 and contacts the first bottom pad 42. A via 13 connects the metallized circuit 11 to the first top contact pad 32. A second metallized circuit 15 is patterned on the bottom surface 16 of the substrate 20 and contacts the second bottom contact pad 44. A second via 17 connects the metallized circuit 15 to the second top contact pad 34 on the substrate. Thus, solder ball 22 is electrically coupled to solder ball 52 and solder ball 24 is electrically coupled to solder ball 54.

Figure 3:
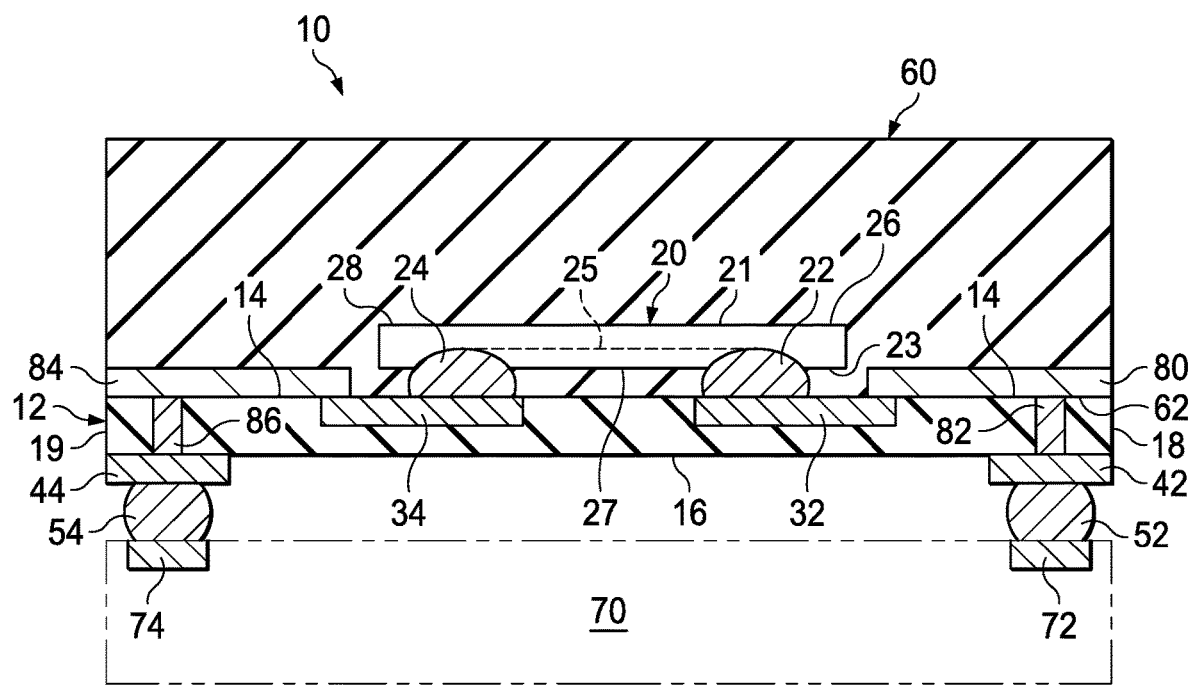

In an alternative embodiment, as shown in the illustrative embodiment of FIG. 3, a metallized circuit 80 formed on substrate surface 14 contacts the contact pad 32 and is connected by a via 82 to the contact pad 42, replacing metallized circuit 11 and via 13. Similarly another upper metallized circuit 84 on surface 14 may contact the upper contact pad 34 and a via 86 may extend between that metallized circuit and contact pad 44 replacing metallized layer 15 and via 17.

A layer of mold compound 60 encapsulates the BAW device die 20. A bottom surface 62 of the mold compound 60 interfaces with the top surface 14 of the substrate 12.

As illustrated by dashed lines in FIG. 1, the electrical substrate 12 may be connected to another electrical device 70 such as a PC board or another circuit device, having a first contact pad 72 attached to first solder ball 52 and a second contact pad 74 attached to second solder ball 54. In one example embodiment the BAW package 10 acts as a dock circuit for an attached electrical device 70.

In one embodiment, the substrate 12 is formed of a material having a Young's modulus of less than about 10 MPa. The material from which substrate 12 is formed may be, for example, a foam material and/or at least one of silicone, polyisobutylene, polyurethane and acrylic resin.

In another embodiment, the mold compound 60 is formed by a material having a Young's modulus of less than about 100 MPa. The material from which the mold compound 60 is formed may be, for example, a foam material and/or at least one of silicone, polyisobutylene, polyurethane and acrylic resin.

In yet another embodiment the substrate 12 is formed of a material having a Young's modulus of less than about 10 MPa. The material from which substrate 12 is formed may be, for example, a foam material and/or at least one of silicone, polyisobutylene, polyurethane and acrylic resin. In this embodiment the mold compound 60 is formed from a material having a Young's modulus of less than about 100 MPa. The material from which the mold compound 60 is formed may be, for example, a foam material and/or at least one of silicone, polyisobutylene, polyurethane and acrylic resin.

In the illustrated embodiment of FIG. 1 the device mounted on the substrate 12 is a BAW device 20. In other example embodiments other types of acoustical devices are substituted for the BAW device 20, for example a Surface Acoustic Wave (SAW) device, a Love Wave (LW) device or a flexural plate device.

FIG. 2 is a flow chart of a method of making a bulk acoustic wave (BAW) package. The method includes either or both of the steps of physically and electrically mounting a BAW device on an electrical connection substrate formed of material having a Young's modulus of less than about 10 MPa, as shown at block 201; and encapsulating the BAW device in a mold compound layer having a Young's modulus of less than about 100 MPa, as shown at block 202.

Certain specific embodiments of an acoustic device package and methods of making an acoustic device package have been expressly described in detail herein. Alternative embodiments of acoustic device packages and methods of making acoustic device packages will occur to those skilled in the art after reading this disclosure. The claims are intended to be broadly construed to cover all such alternative embodiments, except as limited by the prior art.

What is claimed is:

1. A bulk acoustic wave (BAW) package comprising:
    a substrate formed of material having a Young's modulus of less than about 10 MPa with a first surface and an opposite second surface having first and second spaced apart contact pads on the first surface and first and second spaced apart contact pads on the second surface; and
    a BAW device electrically coupled to said substrate, said BAW device comprising:
        a laterally extending body having a BAW electrical circuit formed therein;
        a first solder ball attached to said laterally extending body and electrically connected to said BAW electrical circuit and electrically connected to said first contact pad on said first surface of said substrate; and
        a second solder ball physically attached to said laterally extending body and electrically connected to said BAW electrical circuit and electrically connected to said second contact pad on said first surface of said substrate; and
        first and second solder balls attached to said first and second spaced apart contact pads on said second surface of said substrate; and
    a mold compound layer covering said BAW device, interfacing with said first surface of said substrate and having a Young's modulus of less than about 100 MPa.

2. The bulk acoustic wave (BAW) package of claim 1, said mold compound layer being formed of a foam material.

3. The bulk acoustic wave (BAW) package of claim 1, said mold compound layer being formed of at least one of silicone, polyisobutylene, polyurethane, and acrylic resin.

4. A method of making a bulk acoustic wave (BAW) package comprising at least one of:
    physically and electrically mounting a BAW device on an electrical connection substrate formed of material having a Young's modulus of less than about 10 MPa; and
    encapsulating said BAW device in a mold compound layer having a Young's modulus of less than about 100 MPa.

5. The bulk acoustic wave (BAW) package of claim 1, a mid portion of said laterally extending body physically spaced apart from said substrate.

6. The bulk acoustic wave (BAW) package of claim 1, said substrate being formed of a foam material.

7. The bulk acoustic wave (BAW) package of claim 1, said substrate being formed of at least one of silicone, polyisobutylene, polyurethane, and acrylic resin.

8. The method of making a bulk acoustic wave (BAW) package of claim 4, said electrical connection substrate being formed of a foam material.

9. The method of making a bulk acoustic wave (BAW) package of claim 4, said electrical connection substrate being formed of at least one of silicone, polyisobutylene, polyurethane, and acrylic resin.

10. The method of making a bulk acoustic wave (BAW) package of claim 4, said mold compound layer being formed of a foam material.

11. The bulk acoustic wave (BAW) package of claim 1, said mold compound layer being formed of at least one of silicone, polyisobutylene, polyurethane, and acrylic resin.

12. A bulk acoustic wave (BAW) package comprising:
    a substrate formed of material having a first Young's modulus; and a BAW device electrically coupled to said substrate, said BAW device comprising:
  a laterally extending body having a BAW electrical circuit formed therein;
  a first solder ball electrically connected to said BAW electrical circuit and electrically connected to said substrate;
  a second solder ball electrically connected to said BAW electrical circuit and electrically connected to said substrate; and
  ; and
a mold compound layer covering said BAW device, and a portion of said substrate, the mold compound layer having a second Young's modulus.

13. The bulk acoustic wave (BAW) package of claim 12, said mold compound layer being formed of a foam material.

14. The bulk acoustic wave (BAW) package of claim 12, said mold compound layer being formed of at least one of silicone, polyisobutylene, polyurethane, and acrylic resin.

15. The bulk acoustic wave (BAW) package of claim 12, said substrate being formed of a foam material.

16. The bulk acoustic wave (BAW) package of claim 12, said substrate being formed of at least one of silicone, polyisobutylene, polyurethane, and acrylic resin.

17. The bulk acoustic wave (BAW) package of claim 12, wherein the first Young's modulus is less than the second Young's modulus.

* * * * *